US012388006B2

(12) United States Patent
Hsieh et al.

(10) Patent No.: US 12,388,006 B2
(45) Date of Patent: Aug. 12, 2025

(54) CAPACITOR AND AIRGAP STRUCTURE

(71) Applicant: GLOBALFOUNDRIES Singapore Pte. Ltd., Singapore (SG)

(72) Inventors: Chun-I Hsieh, Singapore (SG); Ee Jan Khor, Singapore (SG); Wei-Hui Hsu, Singapore (SG); Wanbing Yi, Singapore (SG); Juan Boon Tan, Singapore (SG)

(73) Assignee: GLOBALFOUNDRIES Singapore Pte. Ltd., Singapore (SG)

( * ) Notice: Subject to any disclaimer, the term of this patent is extended or adjusted under 35 U.S.C. 154(b) by 506 days.

(21) Appl. No.: 17/836,251

(22) Filed: Jun. 9, 2022

(65) Prior Publication Data

US 2023/0402365 A1 Dec. 14, 2023

(51) Int. Cl.
*H01L 29/76* (2006.01)
*H01L 21/768* (2006.01)
*H01L 23/522* (2006.01)
*H01L 23/528* (2006.01)
*H01L 29/94* (2006.01)

(52) U.S. Cl.
CPC .... *H01L 23/5223* (2013.01); *H01L 21/76802* (2013.01); *H01L 21/7682* (2013.01); *H01L 23/528* (2013.01)

(58) Field of Classification Search
CPC .......... H01L 23/5223; H01L 21/76802; H01L 21/7682; H01L 23/528; H01L 23/53295; H01L 23/5222; H01L 23/5226
USPC ........................................................ 257/295
See application file for complete search history.

(56) References Cited

U.S. PATENT DOCUMENTS

| | | |
|---|---|---|
| 9,252,204 B2 | 2/2016 | Adkisson et al. |
| 10,032,711 B2 | 7/2018 | Basker et al. |
| 10,373,905 B2 | 8/2019 | Basker et al. |
| 2018/0233446 A1* | 8/2018 | Basker ............... H10D 1/692 |

OTHER PUBLICATIONS

Klootwijk et al., "Ultrahigh Capacitance Density for Multiple ALD-Grown MIM Capacitor Stacks in 3-D Silicon", IEEE Electron Device Letters, vol. 29, No. 7, Jul. 2008, Abstract, 3 pages.

* cited by examiner

*Primary Examiner* — Theresa T Doan
(74) *Attorney, Agent, or Firm* — Anthony Canale; Andrew M. Calderon; Calderon Safran & Wright P.C.

(57) ABSTRACT

The present disclosure relates to semiconductor structures and, more particularly, to capacitor structures and methods of manufacture. The structure includes: an airgap provided within a dielectric material; an insulator material across a top of the airgap and on a surface of the dielectric material; and a capacitor provided within the dielectric material and lined with the insulator material.

17 Claims, 4 Drawing Sheets

CAPACITOR AND AIRGAP STRUCTURE

BACKGROUND

The present disclosure relates to semiconductor structures and, more particularly, to capacitor structures and methods of manufacture.

A capacitor is a device for storing electrical energy. The capacitor consists of two conductors (e.g., an upper metal and lower metal plate) in close proximity to one another with an insulator material therebetween. A simple example of such a storage device is a parallel-plate capacitor.

In semiconductor devices, the capacitor is typically fabricated above a wiring structure within an underlying dielectric material. This results in the capacitor being on a different level as the wiring structure and having a different topology than the wiring structure, which makes it difficult to land contacts on the upper plate of the capacitor. For example, landing on the top plate of the capacitor has no margin due to the topography of the structure. The different topography may also result in punch through of the top plate during the etching process.

SUMMARY

In an aspect of the disclosure, a structure comprises: an airgap provided within a dielectric material; an insulator material across a top of the airgap and on a surface of the dielectric material; and a capacitor provided within the dielectric material and lined with the insulator material.

In an aspect of the disclosure, a structure comprises: an airgap structure within a dielectric material; a wiring structure within the dielectric material; a liner over the dielectric material and wiring structure; and a capacitor within the dielectric material, the capacitor having a height greater than a combined height of the wiring structure and the liner.

In an aspect of the disclosure, a method comprising: forming an airgap within a dielectric material, the forming of the airgap comprising: forming a trench in the dielectric material; and pinching off the trench with an insulator material which also lines sidewalls; and forming a capacitor provided within the dielectric material and lined with the insulator material, the forming of the capacitor comprising: forming another trench in the dielectric material; lining the trench with the insulator material; forming capacitor materials in the trench and over the insulator material; and removing any excessive capacitor materials from a top surface of the insulator material.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

The present disclosure relates to semiconductor structures and, more particularly, to capacitor structures and methods of manufacture. More specifically, the present disclosure relates to a metal-insulator-metal capacitor fabricated with an air-gap process flow. Advantageously, the process flow provides a larger margin for landing a contact onto the metal-insulator-metal capacitor, while also reducing fabrication processing steps. In addition, it is now possible to reduce the thickness of the interlevel dielectric layer above the capacitor, lower the aspect ratio (A/R) etch and provide a shorter planarization process as the topography of the capacitor is mostly removed.

In more specific embodiments, an air gap and a capacitor may be provided at a same level of the device, within a dielectric material used with a metal wiring structure. The method includes, for example, forming a first trench adjacent to a second trench in the dielectric material. An insulator material (e.g., silicon oxide) may be deposited in the first trench and the second trench, wherein the insulator material pinches-off the top of the first trench to form an air gap, while the insulator material forms on sidewalls and a lower surface of the second trench. The capacitor material may then be formed in the second trench, over the insulator material. The insulator material provides a longer sidewall for the bottom plate of the capacitor (e.g., extends above a liner or blocking layer) resulting in a higher capacitance compared to conventional capacitors, amongst other advantages.

The capacitor of the present disclosure can be manufactured in a number of ways using a number of different tools. In general, though, the methodologies and tools are used to form structures with dimensions in the micrometer and nanometer scale. The methodologies, i.e., technologies, employed to manufacture the capacitor of the present disclosure have been adopted from integrated circuit (IC) technology. For example, the structures are built on wafers and are realized in films of material patterned by photolithographic processes on the top of a wafer. In particular, the fabrication of the capacitor uses three basic building blocks: (i) deposition of thin films of material on a substrate, (ii) applying a patterned mask on top of the films by photolithographic imaging, and (iii) etching the films selectively to the mask. In addition, precleaning processes may be used to clean etched surfaces of any contaminants, as is known in the art. Moreover, when necessary, rapid thermal anneal processes may be used to drive-in dopants or material layers as is known in the art.

Figure 1:
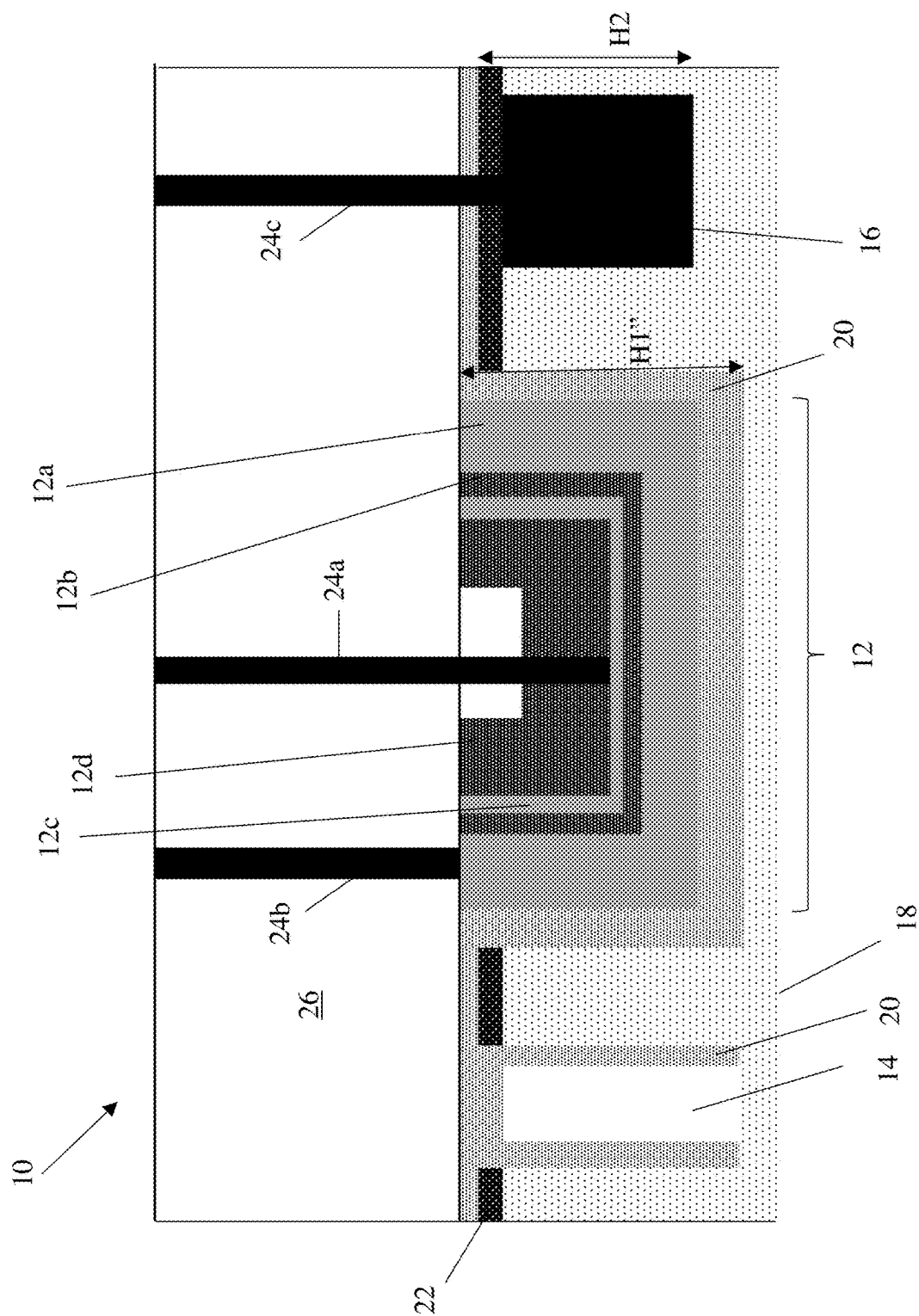
FIG. 1 shows a capacitor and air gap structure, amongst other features, in accordance with aspects of the present disclosure.

FIG. 1 shows a capacitor and air gap structure, amongst other features, in accordance with aspects of the present disclosure. More specifically, the structure 10 includes a capacitor 12, airgap 14 and a wiring structure 16 in a dielectric material 18. In embodiments, the capacitor 12, airgap 14 and wiring structure 16 are provided at a same level of the device, within the dielectric material 18. The dielectric material 18 may be any appropriate dielectric material, e.g., $SiO_2$.

The capacitor 12 and the airgap 14 may be lined with an insulator material 20 (e.g., $SiO_2$). In embodiments, the insulator material 20 may completely line the bottom and side portions of the capacitor 12, in addition to on an upper surface of the dielectric material 18. In additional embodiments, the insulator material 20 may line the sidewalls of the airgap 14. The insulator material 20 may also pinch off or plug the airgap 14 at an upper side thereof. In addition, the insulator material 20 may increase the capacitance of the capacitor 12 by extending the length of the bottom plate 12a of the capacitor 12 as further described below.

Still referring to FIG. 1, the capacitor 12 includes a layered structure of metal and insulator material. For example, the capacitor 12 may include a metal layer or lower plate 12a comprising, for example, Ti/TiN/Al or Ti/TiN/Al/Ti/TiN, formed on the insulator material 20. An insulator material 12b may be on the lower plate 12a. In embodiments, the insulator material 12b may be SiN. A metal layer or upper plate 12c may be on the insulator material 12b. In embodiments, the upper plate 12c may be, for example, TiN.

An insulator material 12d may be over the upper plate 12c. The insulator material 12d may be SiN. As described in more detail with respect to FIGS. 3A-3C, the insulator material 12d may be a U-shape in which a contact 24a extends therethrough to make electrical contact with the top plate 12c of the capacitor 12. Also, the capacitor 12 may be planar with the top surface of the insulator material 20, e.g., have a planar topography.

The wiring structure 16 may be formed in the dielectric material 18. In embodiments, the wiring structure 16 may be aluminum or copper. A liner 22 may be formed over the wiring structure 16. In embodiments, the liner 22 may be SiN as an example. The liner 22 does not extend across the capacitor 12 or the airgap 14. That is, the capacitor 12 is devoid of any liner material on its surface. The insulator material 20 may be formed over the liner 22.

In embodiments, the bottom plate 12a of the capacitor 12 may be at a same level or higher than the wiring structure 16; that is, the bottom plate 12a of the capacitor 12 should preferably not be lower than the bottom of the wiring structure 16 as this may affect underlying devices or metal layers. In further embodiments, a height H1 of the sidewall of the capacitor 12 is greater than a combined height H2 of the wiring structure 16 and the liner 22. More specifically, the wiring structure 16 extends to an underside of the liner 22 and the insulator material 20, whereas an upper surface of the capacitor 12 may be above the liner 22 and planar with a surface of the insulator material 20. Also, in this embodiment, the upper surfaces of layers 12a, 12b, 12c, 12d may be planar with an upper surface of the insulator material 20.

FIG. 1 further shows contacts 24a, 24b, 24c within an interlevel dielectric material 26 and extending to the different plates 12a, 12c and metal wiring structure 16. In embodiments, the interlevel dielectric material 26 may be a layered structure of oxide and nitride materials, and the contacts 24a, 24b, 24c may be copper formed by an electroplating process. The contact 24a extends to and contacts the top plate 12c of the capacitor 12, the contact 24b extends to and contacts the bottom plate 12a of the capacitor 12, and the contact 24c extends to and contacts the wiring structure 16.

As should be understood by those of skill in the art, as the capacitor 12 is located within the dielectric material 18, the thickness of the interlevel dielectric material 26 and the chemical mechanical polishing (CMP) loss can be significantly reduced, as the capacitor 12 is not formed on a surface of the dielectric material 18. Also, the contact 24b no longer needs to cover the topography of the capacitor 12 that would extend to within the interlevel dielectric material 26. Moreover, in this arrangement, the bottom plate 12a provides a larger landing space (compared to conventional devices), allowing easier alignment with and contact to the bottom plate 12a. In the case that the critical dimensions of the contact 24b is larger than the landing of the bottom plate 12a, an additional processing step may replace an upper portion of the top plate 12c with insulator material. In addition, the insulator material 20 on the sidewall of the trench 25 can provide a capacitance increase due to the insulator material 20 on the sidewall of the trench 25 being taller than the trench 25, itself, e.g., MIM cavity.

Figure 2:
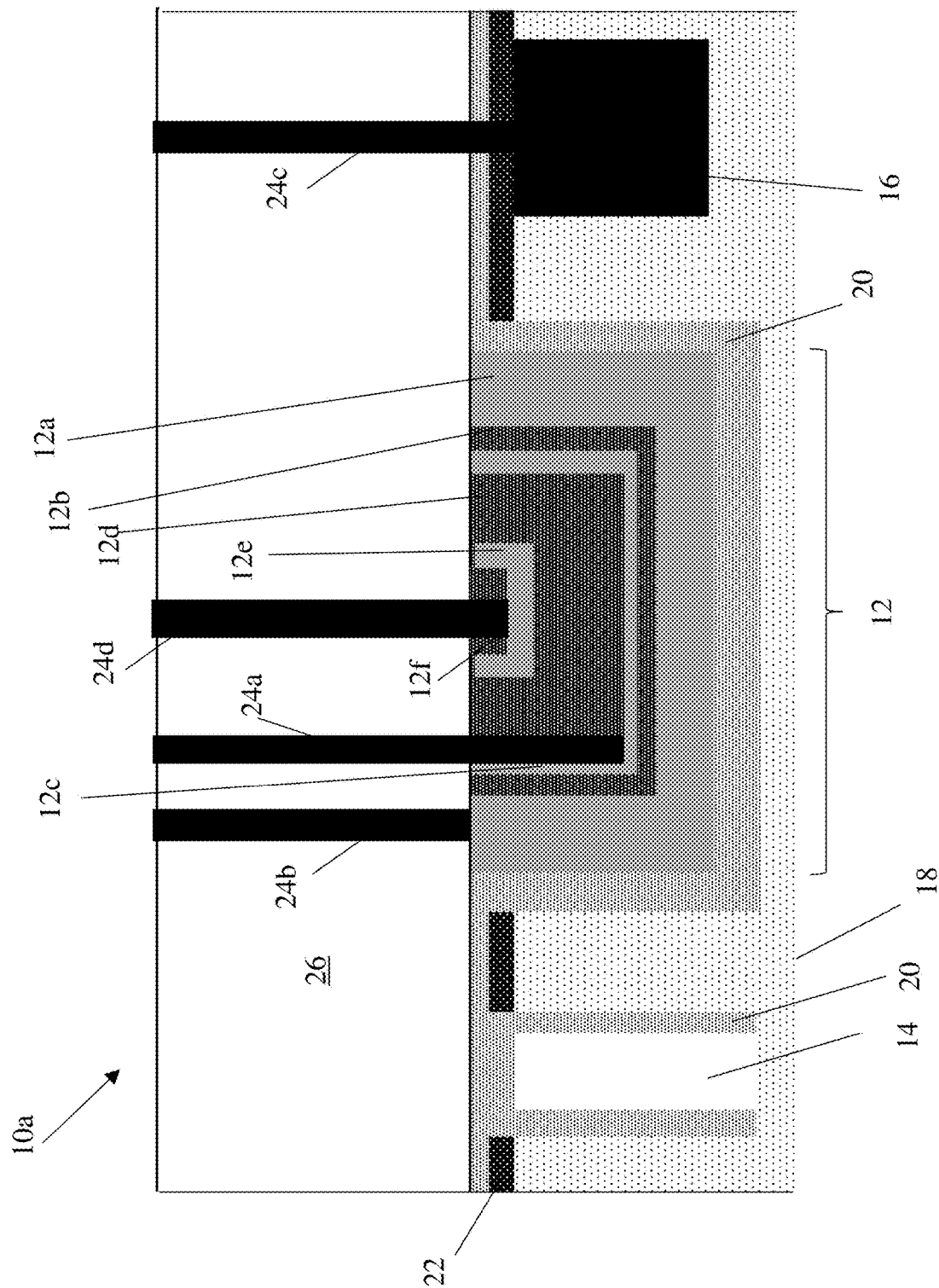
FIG. 2 shows a capacitor and air gap structure, amongst other features, in accordance with additional aspects of the present disclosure.

FIG. 2 shows a capacitor and air gap structure, amongst other features, in accordance with additional aspects of the present disclosure. More specifically, the structure 10a of FIG. 2 includes an additional metal plate 12e of the capacitor 12, with a contact 24d extending to and making electrical connection to the additional metal plate 12e. The additional metal plate 12e may be electrically isolated from the plate 12c by the insulator material 12d. An additional insulator layer 12f may be over the additional metal plate 12e. In this embodiment, the additional insulator layer 12f may be planar with a surface of the other layers 12a, 12b, 12c, 12d, 12e, in addition to an upper surface of the insulator material 20. In this embodiment, the contact 24a may be moved over to contact the plate 12c so as to not interfere with the contact 24d. As should be understood by those of skill in the art, the additional metal plate 12e may be used to increase the capacitance of the capacitor 12.

Figure 3A:
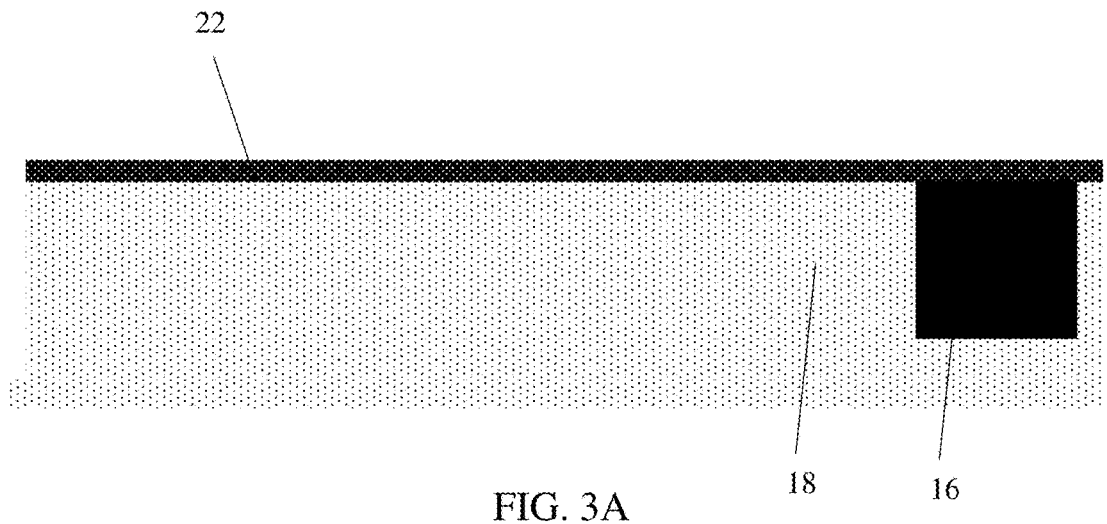
FIGS. 3A-3C show processing steps for fabricating the capacitor and air gap structure, amongst other features, in accordance with aspects of the present disclosure.
Figure 3B:
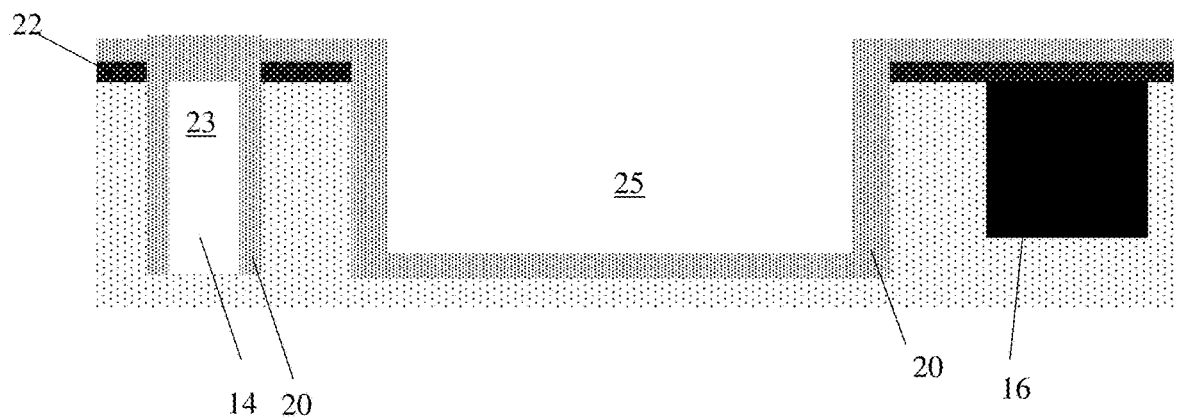
Figure 3C:
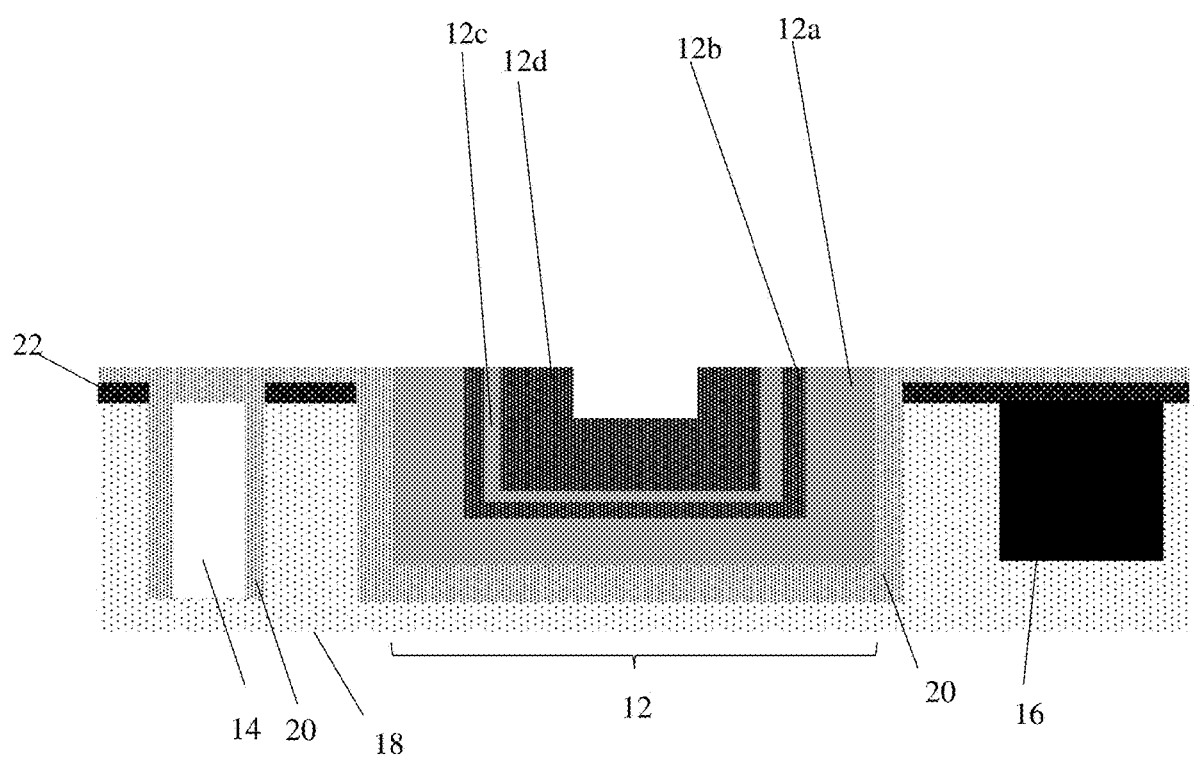

FIGS. 3A-3C show processes steps for fabricating the structure 10 of FIG. 1. Similar steps can be used for the fabrication of the structure 10a of FIG. 2, with the additional of deposition steps for the additional plate and insulator material, in addition to the added contact to the additional plate.

More specifically and referring to FIG. 3A, the metal wiring structure 16 may be formed within the dielectric material 18 using conventional lithography, etching and deposition methods known to those of skill in the art. For example, a resist formed over the dielectric material 18 is exposed to energy (light) and developed to form a pattern (opening). An etching process with a selective chemistry, e.g., reactive ion etching (RIE), will be used to transfer the pattern into the dielectric material 18 through the openings of the resist. Following the resist removal by a conventional oxygen ashing process or other known stripants, conductive material, e.g., aluminum, can be deposited by any conventional deposition processes, e.g., chemical vapor deposition (CVD) processes. Any residual material on the surface of the dielectric material 18 can be removed by conventional chemical mechanical polishing (CMP) processes.

Following the deposition of the conductive material, a liner 22 may be formed over the metal wiring structure 16. The liner 22 may be a nitride material or other capping material. The liner 22 may be formed by a conventional deposition process, e.g., CVD.

In FIG. 3B, trenches 23, 25 may be formed within the dielectric material 18. In embodiments, the trenches 23, 25 may be formed by conventional lithography and etching processes as described herein. The trenches 23, 25 preferably have different dimensions, with the trench 23 having a smaller cross-section than the trench 25. In this way, the trench 23 may be used for an airgap structure, which can be pinched off by the deposition of the insulator material 20, whereas the insulator material 20 may only cover the bottom and side surfaces of the trench 25 (which is used for the capacitor). For example, the trench 23 may be about 150 nm wide and the trench 25 may be 10 μm wide; however, other dimensions are contemplated herein noting that the trench 23 should be of such a dimension to permit pinch-off from the insulator material to form the airgap 14, whereas the trench 25 has a dimension that can further accommodate the capacitor materials. It should also be recognized that the trenches 23, 25 may be formed through the liner 22 and that the insulator material 20 is deposited over the liner 22.

As further shown in FIG. 3C, the capacitor materials 12a, 12b, 12c and 12d are sequentially deposited within the trench 25. In embodiments, the capacitor materials 12a, 12b, 12c and 12d may be deposited by any conventional deposition process including, for example, a plasma vapor deposition (PVD) process. In embodiments, the upper insulator material 12*d* will have a U-shape. Also, as shown in FIG. 3C, a portion of each of the capacitor materials 12*a*, 12*b*, 12*c* and 12*d* will be above the liner 22.

After the deposition process, the capacitor materials 12*a*, 12*b*, 12*c* and 12*d* may be subjected to a CMP process in which the capacitor materials 12*a*, 12*b*, 12*c* and 12*d* will be planar with an upper surface of the oxide material 20. In this way, there is no capacitor materials, e.g., bottom metal plate 12*a*, insulator material 12*b* or top metal plate 12*c* laterally extending over the liner 22, the insulator material 20 or the dielectric material 18. In other words, the capacitor materials 12*a*, 12*b*, 12*c* are confined to within and above the trench 25. In the embodiment of FIG. 2, for example, additional capacitor materials 12*e*, 12*f* may be deposited in a similar manner and subjected to a CMP process as noted herein.

Referring back to FIG. 1, an interlevel dielectric material 26 may be deposited over the structures, e.g., airgap 14, capacitor 12 and metal wiring structure 16. The interlevel dielectric material 26 may be deposited by a conventional CVD process. A via may be formed within the interlevel dielectric material 26 to expose the bottom plate 12*a* of the capacitor 12. Another via may be formed in the interlevel dielectric material 26, oxide material 20 and liner 22 to expose the underlying metal wiring structure 16. Still another via may be formed through the interlevel dielectric material 26 and the insulator material 12*d* to expose the top plate 12*c* of the capacitor 12. In embodiments, the vias may be formed by conventional lithography and etching process as described herein and as is known in the art such that no further explanation is required for a complete understanding of the present disclosure.

The contacts 24*a*, 24*b*, 24*c* may be deposited within the vias by an electroplating process. Any residual material on the surface of the interlevel dielectric material 26 may be removed by a CMP process. In the case of the structure 10*a* of FIG. 2, an additional via and contact 24*d* can be formed in the manner as described herein to make contact to the additional, upper metal plate 12*e*. In this embodiment, the contact 24*a* may be moved over to contact the plate 12*c* so as to not interfere with the contact 24*d*.

The capacitor can be utilized in system on chip (SoC) technology. The SoC is an integrated circuit (also known as a "chip") that integrates all components of an electronic system on a single chip or substrate. As the components are integrated on a single substrate, SoCs consume much less power and take up much less area than multichip designs with equivalent functionality. Because of this, SoCs are becoming the dominant force in the mobile computing (such as in Smartphones) and edge computing markets. SoC is also used in embedded systems and the Internet of Things.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A structure comprising:
   an airgap provided within a dielectric material;
   an insulator material across a top of the airgap and on a surface of the dielectric material;
   a capacitor provided within the dielectric material and lined with the insulator material; and
   a U-shaped insulator material over a top plate of the capacitor, and a contact extending within the U-shaped insulator material to contact the top plate of the capacitor.

2. The structure of claim 1, wherein the insulator material lines sidewalls of the airgap.

3. The structure of claim 1, wherein the insulator material is over a liner material which is on the dielectric material.

4. The structure of claim 3, wherein the capacitor extends through the liner material.

5. The structure of claim 3, wherein a top surface of the capacitor is devoid of the liner material.

6. The structure of claim 3, wherein the capacitor includes a bottom plate, a top plate and an insulator material between the top plate and the bottom plate, the bottom plate having a height extending above a surface of the liner material.

7. A structure comprising:
   an airgap provided within a dielectric material;
   an insulator material across a top of the airgap and on a surface of the dielectric material; and
   a capacitor provided within the dielectric material and lined with the insulator material, wherein the capacitor comprises a bottom plate, a top plate and an insulator material between the top plate and the bottom plate, each of which are aligned with a trench in the dielectric material and which do not extend laterally over an upper surface of the insulator material.

8. The structure of claim 7, further comprising a wiring structure within the dielectric material and a liner material over the wiring structure and under the insulator material.

9. The structure of claim 8, wherein the bottom plate of the capacitor does not extend below the wiring structure.

10. The structure of claim 8, wherein the bottom plate of the capacitor has a height that exceeds a combination of the wiring structure and the liner material.

11. The structure of claim 8, wherein the bottom plate and the top plate of the capacitor do not extend laterally over the liner material.

12. A structure comprising:
   an airgap structure within a dielectric material;
   a wiring structure within the dielectric material;
   a liner over the dielectric material and wiring structure; and a capacitor within the dielectric material, the capacitor having a height greater than a combined height of the wiring structure and the liner; and insulator material that lines and extends over the airgap structure.

13. The structure of claim 12, wherein the insulator material is under the capacitor and extends onto a surface of the liner.

14. The structure of claim 12, wherein the capacitor comprises a bottom plate, an insulator layer and a top plate, each of which has a surface planar with the insulator material.

15. The structure of claim 14, wherein the capacitor has a height greater than a combined height of the wiring structure and the liner.

16. The structure of claim 12, wherein a top surface of the capacitor is devoid of the liner.

17. The structure of claim 12, wherein a bottom plate of the capacitor is at or above a bottom surface of the wiring structure.

* * * * *